United States Patent [19]

Kramer et al.

[11] Patent Number: 5,278,513
[45] Date of Patent: Jan. 11, 1994

[54] CONTINUOUS CONDITION SENSING SYSTEM

[75] Inventors: L. Jonathan Kramer, Warminster; Steven R. Petersen, Ambler; Herbert A. Shauger, Jr., Doylestown, all of Pa.

[73] Assignee: Drexelbrook Controls, Inc., Horsham, Pa.

[21] Appl. No.: 748,960

[22] Filed: Aug. 22, 1991

Related U.S. Application Data

[63] Continuation of Ser. No. 495,733, Mar. 19, 1990, Pat. No. 5,045,797, which is a continuation of Ser. No. 222,498, Jul. 21, 1988, Pat. No. 4,950,998, which is a continuation of Ser. No. 917,958, Oct. 14, 1986, Pat. No. 4,788,488.

[51] Int. Cl.[5] ............................................. G01R 27/26
[52] U.S. Cl. .................................... 324/667; 324/611; 324/671; 324/679
[58] Field of Search ............... 324/671, 674, 681, 611, 324/663, 667, 693, 699, 707, 716, 679, 665, 705, 678; 73/304

[56] References Cited

U.S. PATENT DOCUMENTS

| 3,140,608 | 7/1964 | Clark | 324/61 QS |
|---|---|---|---|
| 3,467,861 | 9/1969 | Grant | 324/667 |
| 3,746,975 | 7/1973 | Maltby | 73/304 C |
| 4,222,267 | 9/1980 | Aldrich | 73/304 C |
| 4,232,300 | 11/1980 | Wright et al. | 73/304 C |
| 4,347,740 | 9/1982 | Townsend | 324/677 |
| 4,383,444 | 5/1983 | Beaman et al. | 73/304 C |
| 4,589,281 | 5/1986 | Aldrich | 73/304 C |
| 4,723,122 | 2/1988 | Maltby et al. | 73/304 C |
| 4,788,488 | 11/1988 | Kramer et al. | 73/304 C |
| 4,950,998 | 8/1990 | Kramer et al. | 324/674 |
| 5,045,797 | 9/1991 | Kramer et al. | 324/671 |

Primary Examiner—Kenneth A. Wieder
Assistant Examiner—Maura K. Regan
Attorney, Agent, or Firm—Woodcock Washburn Kurtz Mackiewicz & Norris

[57] ABSTRACT

A probe developing an admittance with a material whose condition is to be continuously measured is capacitively coupled with a variable frequency oscillator, preferably one having a digital output stage, for generating a variable frequency signal having a period varying with the admittance developed at the probe. Both the oscillator input and output are capacitively coupled to the probe. In a preferred embodiment, a set point circuit including a plurality of resistors coupled in parallel with the oscillator output and a plurality of switches coupled in parallel with the probe conductor and each with a different one of the resistor, provides easy circuit adjustment for use of the system with a variety of materials. A preferred digital circuit employing a pair of flip flops, fixed timer and one shot generate a fixed period variable duration duty cycle digital voltage level signal for transmission, if desired, or for conversion into a variable current signal.

2 Claims, 6 Drawing Sheets

CONTINUOUS CONDITION SENSING SYSTEM

This is a continuation of application Ser. No. 495,733, filed Mar. 19, 1990, now U.S. Pat. No. 5,048,797, which in turn is a continuation of application Ser. No. 222,498, filed Jul. 21, 1988, and which is now U.S. Pat. No. 4,950,998, which in turn is a continuation of application Ser. No. 917,958, filed Oct. 14, 1986, which is now U.S. Pat. No. 4,788,488.

BACKGROUND OF THE INVENTION

This invention relates to systems for continuous monitoring of a condition of a material such as material level and, in particular, to systems developing an output varying in relation to changing admittance.

U.S. Pat. No. 4,146,834, assigned to the assignee of this invention, describes various admittance responsive measuring systems for sensing the condition of materials. More particularly, two-wire transmitter systems, each working with an admittance probe and each including an admittance responsive network generating a signal representing the condition of the monitored material, are described. Each of the various described systems couples an admittance probe in a balanced bridge circuit and drives the probe and bridge circuit by means of an oscillator having a fixed frequency output. Such bridge systems provide very accurate measurement of admittance, particularly at and around the reference admittance point. However, this accuracy degenerates as the measured admittance increasingly differs from the reference admittance. Moreover, such systems typically employ transformers, phase detectors, demodulators, or and other complex, expensive, circuitry.

A much simpler two-wire capacitive, material level measuring system is described in U.S. Pat. No. 4,347,740. There, a capacitive measuring probe is connected to one input of an operational amplifier and is connected to the output of the operational amplifier through a resistor to form a free-running oscillator. The frequency of the oscillator output is, generally speaking, inversely related to the magnitude of the capacitance being developed by the probe and the material. A switching transistor is connected to the output of operational amplifier to generate a changing current output signal. The operational amplifier output is also passed back to the probe through either of two resistors, the values of which are selected to change the period of the oscillating signal developed in the free running oscillator, to drive the probe.

The system of U.S. Pat. No. 4,347,740 is much simpler and less expensive than the systems described in U.S. Pat. No. 4,146,834. However, the former invention has its own set of limitations. First, a resistance between the probe electrode and ground, which would be present with any material which is not perfectly insulative, produces a current which will affect the charge and discharge times of the probe capacitance, thereby changing the period and thus the frequency of the free-running oscillator. Asymmetric charge/discharge impedences of the system tend to aggravate the errors caused by the resistance.

U.S. Pat. No. 4,515,015 describes a capacitive level sensing device improved over that described in U.S. Pat. No. 4,347,740. This system uses an insulated probe electrode and a charging resistor having a resistance which is small with respect to the resistance of the material being measured so that a buildup or coating of the material has a diminished effect on the measurements. This does not prevent a stray current from being generated with the probe which would affect the frequency of the output signal of the oscillator.

OBJECTS AND SUMMARY OF THE INVENTION

It is a primary object of the invention to provide a simple, rugged, reliable and inexpensive continuous material condition level detection system.

It is yet another object to provide such a system for monitoring both dielectric and conductive materials.

It is yet another object to provide such a system generating a variable frequency output.

It is yet another object of the invention to minimize the effect of any conductance in parallel with the sensing probe of such a system on the variable frequency output of the system.

It is another object of the invention to prevent galvanic action by the measuring probe.

These and other objects of the invention are satisfied by a system for continuously monitoring a material condition such as height or level, by developing an admittance with the material and a probe. The admittance varies with changes in the condition of the material. An oscillator is coupled with the probe and generates at its output an oscillating signal having a period of oscillation varying with variations in the admittance at the probe. The probe is coupled with the oscillator by means of a first circuit between the probe and a signal input of the oscillator. A second circuit feeds the oscillating signal output of the oscillator back to the probe through a portion of the first circuit for charging and discharging the probe. A capacitor is provided in the first circuit in series with the probe and between the probe and the oscillator for capacitively coupling the probe with both the signal input and signal output of the oscillator. This prevents any direct current component from leaking through the probe to ground thereby changing the charge/discharge time of the circuit. Thus, the capacitor is provided even where an essentially non-conductive material is used in combination with a bare probe electrode (i.e. uninsulated conductor directly contacting the material) and where an insulated probe (i.e. an electrical conductor covered with electrical insulation to shield the conductor from direct contact with the material to be measured) is employed.

It is another object of the invention to insure that the oscillator of the system operates over its linear range.

To that end the capacitance of the coupling capacitor between the probe and the oscillator is significantly larger than the largest variable capacitance which can be generated by the probe and the particular material being monitored.

It is yet another object of the invention to provide a variable frequency output admittance detector configured such that a wide range of input full scale capacitances generate a restricted range of frequency outputs.

It is yet another object of the invention to configure the detector circuit so that it is possible to provide continuous adjustment of span and zero setting on any selected range of frequency outputs.

According to the invention, these and other previously identified objects are satisfied by the further provision of a step span circuit between the oscillator output and the probe. The step span circuit includes a plurality of resistors each having an end coupled in parallel with the oscillator output, an equal plurality of switches each having an end coupled in parallel with the probe and remaining end coupled with the remaining end of a different one of the resistors so that one or more of the resistors may be coupled into the feedback circuit between the oscillator output and the probe. Further according to the aspect of this invention, an equal plurality of capacitors is also provided each coupled with a different one of the resistors for greater step span selection range.

It is yet another object of the invention to provide a material responsive detection system transmitter offering a variety of output signal waveforms.

It is yet another object of the invention to provide a material condition responsive transmitter with low power consumption requirements.

It is yet another object of the invention to provide such a system outputting one or more logic level variable signals.

These objects are satisfied according to the invention, first by driving a multivibrator or developing logic level outputs with the probe. Further according to this aspect of the invention, a logic level duty cycle signal is developed by the provision of a pair of D-type flip-flops, each clocked by the variable frequency output signal from the multivibrator, a logic level fixed time base timer and a one shot. A first flip-flop is set by a pulse outputted by the fixed time base timer and reset by a longer pulse outputted by a one shot, itself triggered by the second flip-flop. The second flip-flop receives at its data input the output of the first flip-flop and outputs a duty cycle signal. The duty cycle signal either may be calibrated for span and/or zero prior to transmission or transmitted in an uncalibrated state. Additional circuitry is disclosed for converting the duty cycle output signal to a variable current signal for two-wire current transmission.

BRIEF DESCRIPTION OF THE DRAWINGS

The aforesaid objects and other benefits of the subject invention will be better understood from the following detailed description of the invention and the accompanying figures in which:

FIG. 3a depicts the wave form of the probe signal in FIG. 2 where no coupling capacitor is provided between the probe and the probe oscillator;

FIG. 3b depicts the wave form of the probe of FIG. 2 where a coupling capacitor is provided between the probe and the probe oscillator;

DETAILED DESCRIPTION OF THE INVENTION

Figure 1:
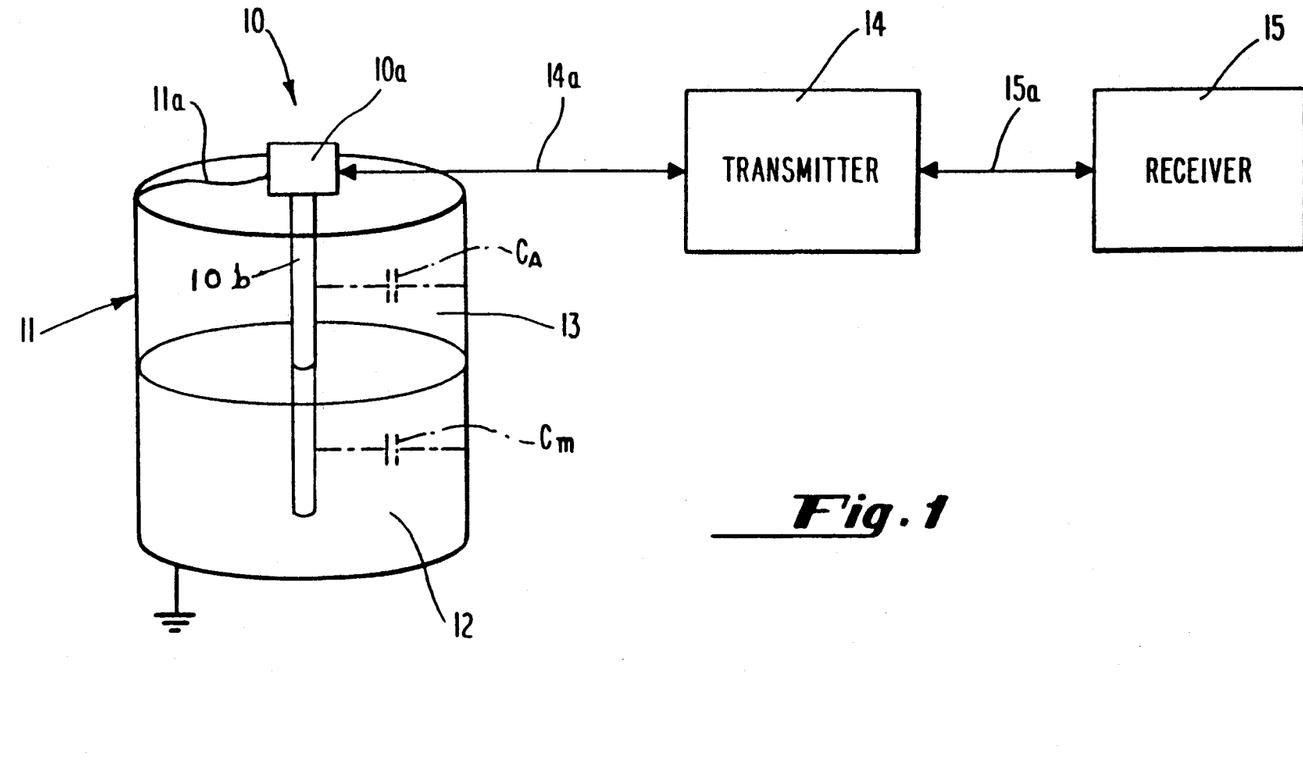
FIG. 1 depicts in block diagram form one configuration of the invention.

FIG. 1 shows one possible configuration for the components of the subject invention. An admittance type level measurement probe 10 is mounted in a tank 11 containing a material 12, a condition of which (i.e. the level) is to be measured. The nature of the material 12 may vary widely and include insulating or conductive liquids or granular materials. Similarly, the shape of the vessel 11 can vary widely. The probe 10 is shown disposed generally vertically in order to provide a change in admittance which varies with the level 13 of the material 12 in the vessel 11. The admittance developed at the probe element 10 provides the input to a transmitter 14. The transmitter 14 is a transducer coupled with the probe by a channel 14a. Transmitter 14 converts the admittance developed at the probe to at least one of a number of possible electrical signals which is transmitted to a remotely located receiver 15 along a channel 15a. The electrical signal outputted from the transmitter 14 may be in the form of a variable direct current, a variable frequency voltage, or a variable duty cycle of voltage or current, for example.

The transmitter 14 is depicted as being remotely located from the sensing probe 10. For that reason the probe is provided with a junction box 10a to couple the active electrode element 10b of the probe with the transmitter 14. It is possible and may even be desirable in some circumstances to locate the circuitry of transmitter 14 directly on the probe 10, thereby eliminating the channel 14a. The active element 10b may be a bare metal conductor for direct contact with the material 12 or a metal conductor insulated by a dielectric coating. Both types may be used with dielectric (i.e. essentially non-conductive) materials while insulated probes are required for conductive materials. The grounded vessel 11 is also coupled to transmitter 14 through line 11a and the junction box 10a and then through the channel 14a.

Figure 2:
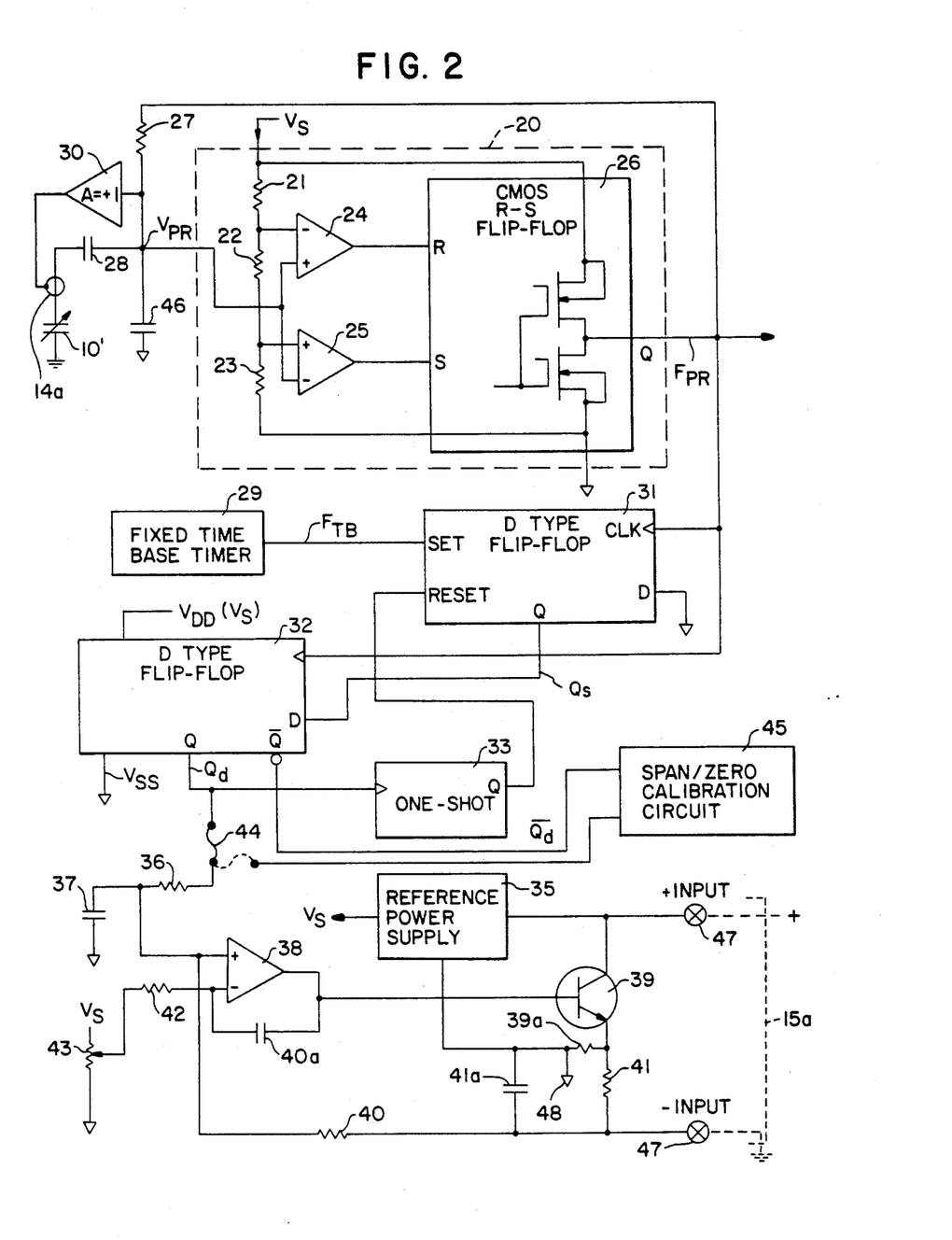
FIG. 2 is a block diagram of a preferred embodiment of the transmitter 14 of FIG. 1.

FIG. 2 depicts in block diagram form a preferred embodiment of a two-wire transmitter of the subject invention. The admittance developed by the probe 10, material 12 and grounded vessel 11 is represented diagrammatically by a variable capacitance 10'. This admittance is coupled to an input of a probe oscillator 20 in the form of an integrated circuit multivibrator 20 having a CMOS RS flip flop output stage. Any increase in probe capacitance 10' will cause a proportional increase in the period of the output signal for the multivibrator I.C. 20. The oscillator 20 includes a resistor divider network formed by three series resistors 21, 22, and 23 which may desirably be of equal value for ease of fabrication, two comparators 24 and 25 and a CMOS RS flip-flop 26. The resistors are connected in series between a system reference voltage $V_s$ and circuit common. The resistors establish a stable voltage equal to two-thirds the reference voltage at the inverting terminal of comparator 24 and a stable voltage equal to one-third the reference voltage at the non-inverting input terminal of comparator 25. The output terminal of comparator 24 is coupled with the reset input of the flip flop 26 while the output terminal of comparator 25 is coupled to the set input of the flip-flop 26. The output of the flip-flop 26 is a square wave signal $F_{PR}$ having a varying frequency the period of which varies directly with changes in the variable capacitance 10'. The output signal $F_{PR}$ of the oscillator 20 will go high when oscillator input level from the probe is less than one third the reference voltage value and low when it is greater than two thirds the reference voltage value. The probe oscillator output signal $F_{PR}$ is carried through a timing or charging resistor represented by resistor 27, to a junction between the probe, represented by variable capacitance 10', and the input to the oscillator. When the output of the multivibrator 20 goes high, the variable capacitance 10' is charged through the resistor 27 or its equivalent to a value which is equal to the reference voltage present at the inverting terminal of comparator 24. At that time, the output of the comparator 24 resets the CMOS flip-flop 26 resulting in a low output voltage level. The variable capacitance 10' then discharges through the resistor 27 or its equivalent to a voltage level equal to the reference voltage present at the non-inverting terminal of comparator 25. At that time, comparator 25 sets the CMOS flip-flop 26 resulting in a high output voltage level from the oscillator 20. This sequence of events continues indefinitely resulting in a square wave output of the CMOS flip-flop which has substantially a 50% duty cycle. An essentially triangular wave form $V_{PR}$ is developed at the junction of the resistor 27 and capacitor 46. This waveform can be seen in FIGS. 3A and 3B under various conditions. Since the charging time for an R-C circuit to charge to one half of its charging voltage is R·C ln 2, the frequency of the multivibrator shown is given by the equation $f = 1/(2 R \cdot C \cdot \ln 2)$ where R is the resistance and C is the capacitance of the circuit and ln 2 is natural logarithm of 2, approximately 0.7. Taking the reciprocal, the period, T, is given by the formula, $T = 1.4 RC$. From this equation, it can be seen that the output period from the counter-timer circuit formed by variable capacitance 10' and resistor 27 is directly proportional to the input capacitance 10'. The output of the oscillator 20 is also carried to a unity gain buffer amplifier 30 so that the channel 14a connecting the probe 10 and transmitter 14 may be guarded. Preferably, channel 14a includes a coaxial conductor with the center conductor coupling the probe electrode with the oscillator 20 and the outer conductor carrying the amplifier 30 output. The unity gain amplifier output may also be applied to any guard electrode(s) in the probe 10, if provided.

An important aspect of the invention is the provision of coupling capacitance, represented by capacitor 28, in series with the probe between the probe and the input and output of the probe oscillator 20. The capacitor 28 minimizes errors which would develop due to a resistance in parallel with the variable capacitance 10' at the probe 10. This effect will be explained in more detail in the subsequent description of FIGS. 3A and 3B. The capacitor 28 also prevents electrochemical action in applications where bare metal electrode probes are employed, and for this reason a similar series capacitor may be provided in series with amplifier 30 output to protect a guard electrode, if used.

The oscillator output $F_{PR}$ is carried to logic circuitry for generation of a voltage duty cycle signal. The circuitry includes timer 29 outputting a stable reference time base signal $F_{TB}$. The period of the reference time base signal $F_{TB}$ is fixed and is determined by a fixed charging resistor-capacitor pair (not depicted). It is suggested that the probe oscillator 20 and fixed time base 29 be incorporated in the same CMOS integrated circuit forming oscillator 20 or at least be of the same type so that the resulting drifts of both devices 20 and 29, not including the exterior timer components, substantially cancel each other. The ratio of the periods of devices 20 and 29 will thus accurately reflect the ratio of the external timing components that are used. The output of the probe oscillator 20 and of the fixed time base timer 29 are connected to logic circuitry which consists of a pair of CMOS D type flip-flops 31 and 32 and a one shot 33, which will extract the first period of the probe oscillator occurring during a time base period. In this way, a duty cycle signal $Q_d$, whose on time varies proportionally with the variable capacitance 10', is present at the data Q output of the flip flop 32. An inversion of this duty cycle signal is present at the inverse data $\overline{Q}_d$ output of the same flip-flop 32. A more detailed description of the duty cycle circuitry will be given subsequently in a discussion which includes the timing diagram of FIG. 4. If the duty cycle produced by this circuitry is switched between circuit common and a stable voltage level, then the duty cycle output will have an average DC voltage proportional to probe capacitance 10' and to the stable voltage level which thus may serve as a reference. The stable voltage level is generated by a reference voltage power supply 35. This supply can be designed in any number of ways that are familiar to one of ordinary skill in the art. One design of this supply includes a precision CMOS operational amplifier, a reference diode and resistive feedback.

The voltage present at $Q_d$ is fed to the non-inverting input of operational amplifier 38 which drives power transistor 39 and series resistor 39a producing a proportional current output through the use of current sensing resistor 41 and feedback resistor 40. The ripple in the duty cycle voltage fed to the non-inverting input of the operational amplifier 38 is substantially removed by capacitor 37 and resistor 36. A bias is typically applied to the inverting input to set a zero level (typically 4 mA for a 4-20 mA two wire transmitter). As the duty cycle is increased, the op amp 38 will apply a higher voltage to the base of transistor 39 so as to increase the output current through resistor 41 towards the upper level (i.e. 20 mA in a 4-20 mA transmitter). Integrating capacitor 40a further filters the ripple caused by the duty cycle input and delays the response time of the output to a rapidly changing input. Note the connection of the bypass capacitor 41a across the resistor 41. This capacitor 41a will take all probe current and shunt it around the DC current sense resistor 41, preventing it from causing measurement errors. Capacitor 40a is provided for smoothing. Any bias level present in the duty cycle signal may be nulled at the amplifier's inverting input through the use of resistor 42 and variable potentiometer 43. Jumper 44 can be positioned as indicated in solid to carry the $\overline{Q}_d$ signal directly to resistor 36 or, as indicated in phantom, to pass a "calibrated" duty cycle output from a span/zero calibration circuit 45 coupled with amplifier 38. This circuit 45 includes fine zero and fine span adjustments which are independent of one another. A more detailed description of this circuit 45 is given later in connection with the description of FIG. 5.

It should be noted that three different electrical signals are generated in the transmitter 14 which are directly proportional to the variable capacitance 10' developed at the probe. The first signal, $F_{PR}$ at the output of CMOS RS flip-flop 26, is a free-running, square wave oscillator whose period is directly proportional to the capacitance 10'. The second signal, $\overline{Q}_d$, at the output of CMOS D flip-flop 32, is a fixed period, variable duty cycle voltage whose on-time is directly proportional to variable capacitance 10'. The third signal, developed at the −INPUT terminal 47 to ground, is a DC current whose magnitude is directly proportional to the capacitance 10'. It should be clear that the variable period signal outputted by flip-flop 26 could easily go to a different output stage which transmits a variable period signal over the output loop 15a. This output stage could consist of a frequency divider like that in the aforesaid U.S. Pat. No. 4,515,015, incorporated by reference, so that the variable frequency signal at flip flop 26 could be converted to a much lower frequency signal suitable for transmission as a voltage or current signal over the output loop. Similarly the variable duty cycle output signal $Q_d$ from flip flop 32 could be generated at a much lower frequency for the same purpose.

Figure 3:
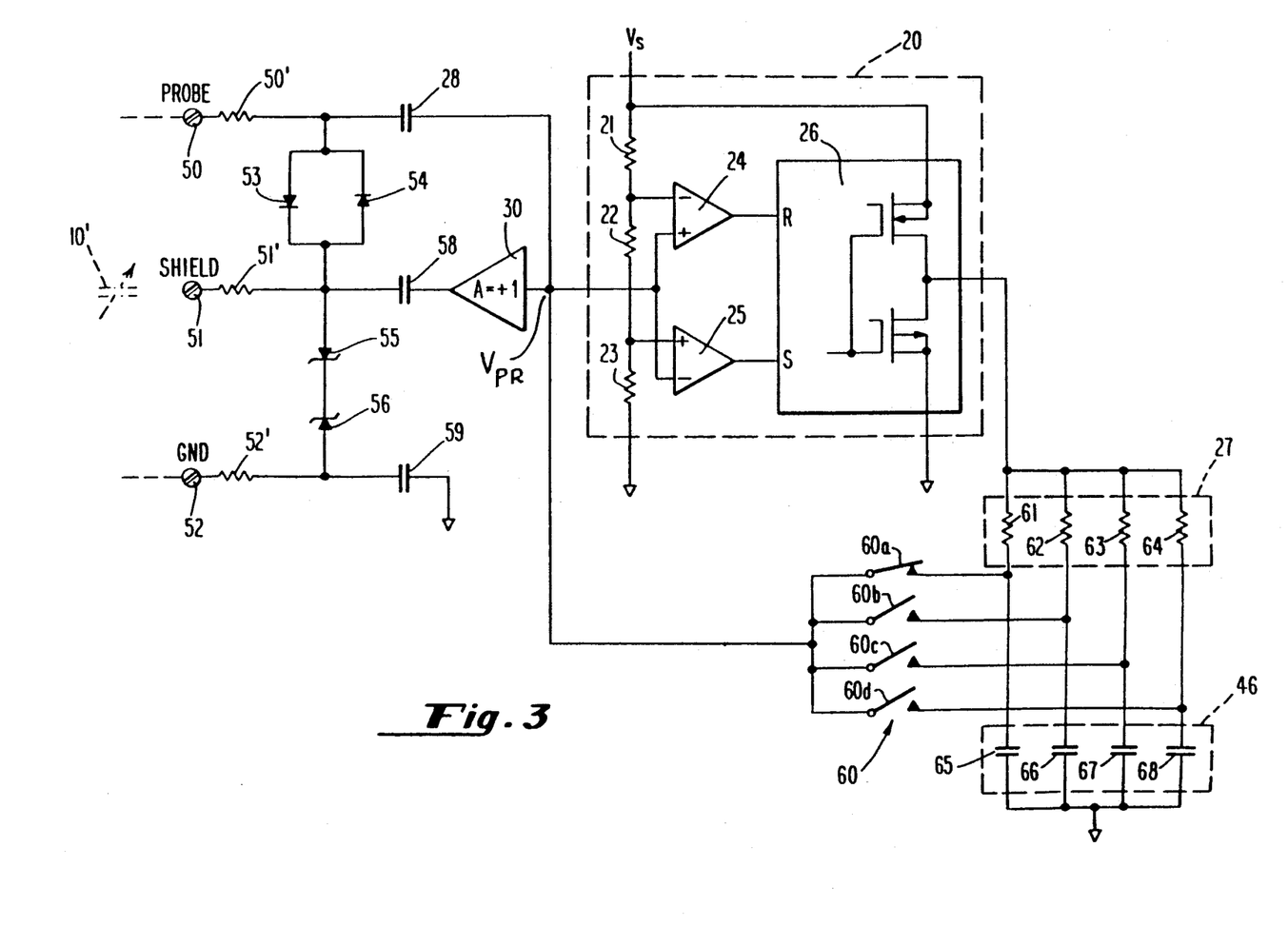
FIG. 3 depicts a preferred step span circuit incorporated into the circuitry of FIG. 2 and a preferred connection of the transmitter with the probe.
Figure 4A:
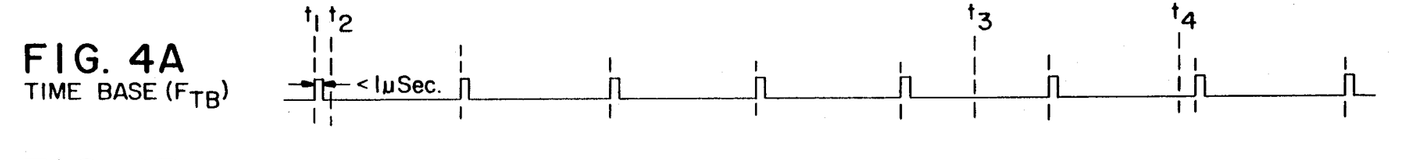
FIGS. 4A-4E are timing diagrams.
Figure 4B:
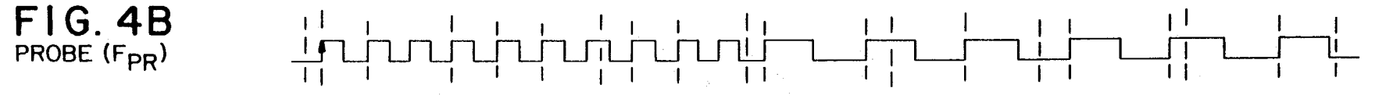
Figure 4C:
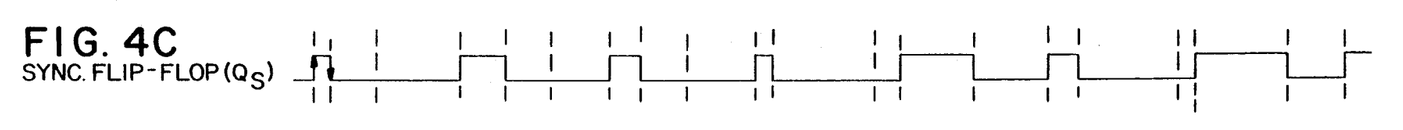
Figure 4D:
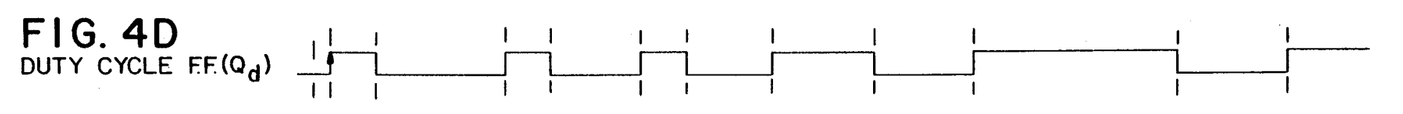
Figure 4E:
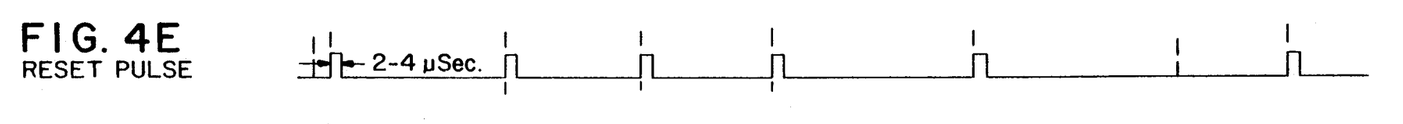

FIG. 3 shows the preferred input circuit of the transmitter 14 in greater detail than is depicted in FIG. 2. Variable capacitor 10', shown across probe and ground terminal connections 50 and 52, again represents the variable capacitance developed by the material 12 and probe 10 in FIG. 1. Spark protection circuitry is made up of resistors 50', 51', 52', and diodes 53, 54, 55, and 56. The method of spark protection, which includes these four diodes is disclosed in U.S. Pat. No. 4,146,834 to Maltby et al, incorporated by reference. Resistors 50', 51', and 52' all serve as current limiting resistors protecting diodes 53, 54, 55 and 56 from damage. Because resistors 50' and 52' are in series with the variable capacitance 10' to be measured, their values must be relatively small compared to the impedance of variable capacitor 10' so that they do not affect the measurement. Another feature of the transmitter input circuit 14 is the capacitive coupling of capacitors 28, 58, 59. Because capacitors 28 and 59 are in series with the probe capacitance 10', their values must be much larger than the largest value of developed variable capacitance 10' so that they do not affect the linearity of the probe oscillator output $F_{PR}$. These capacitors also serve to isolate the probe 10 from any galvanic activity and to permit substantial conductance to be in parallel with the probe 10 with minimal error in the frequency of the output of the probe oscillator 20. It may be mathematically demonstrated that a capacitively coupled probe of this type of probe-multivibrator arrangement will produce a 5- to 10- fold improvement in the rejection of parallel conductance, which is often an undesired component of the probe admittance. This is the case when measuring a substantially insulating material which has some small amount of conductance associated with it.

The probe voltage waveform, $V_{PR}$, developed at the junction between the coupling capacitor 28 and the timing resistance 27, is shown in FIGS. 3A and 3B and points out the marked improvement between a probe circuit with no series coupling capacitance 28 and a probe circuit where a series coupling capacitor is provided. The solid curve in FIG. 3A represents the probe voltage for an ideally capacitive system, which alternates between ⅓ and ⅔ of the reference power supply voltage Vs and has equal charge and discharge times in a period T1. The dashed curve of FIG. 3A shows the probe voltage when the probe to ground impedance is the same as in the case generating the solid curve but with some added resistance in parallel. It can be seen that the dashed curve has a larger charge time because the parallel resistance between probe and ground provides a constant discharge path for the probe to ground capacitance. By the same token, the discharge time period of the probe voltage is shorter when there is some parallel resistance. However, the net effect is that the total charge and discharge cycle period T2 of the dotted curve can be substantially different from the total charge and discharge time period T1 of the solid curve. FIG. 3B shows the probe voltage when series capacitors 28 and 59 of FIG. 3 are included in the circuit. The solid curve, which again shows the probe voltage when the probe to ground impedance is purely capacitive, is the same as the solid curve of FIG. 3A except it has no DC component due to the large blocking capacitors 28 and 59. The dashed wave form, which shows the probe voltage when some shunt resistance has been added, also shows that the probe capacitor 28 tends to discharge more quickly as the probe voltage approaches zero from above or below the time axis. However, this increase in the discharge rate is offset by a similar decrease in the charge rate as the probe voltage moves away from zero volts, either above or below the time axis. The net effect is that both curves in FIG. 3B have much closer periods than do the two curves of FIG. 3A. This results in a substantial improvement in rejection of probe to ground shunt resistance.

Referring again to FIG. 3, it can be seen that resistance 27 and capacitance 46 can be replaced by a step span switch represented generally by the numeral 60 and a plurality of charging resistors 61, 62, 63, and 64, each of which has an end coupled in parallel with the oscillator 20 output and a remaining end which is tied to its own charging capacitor 65, 66, 67 and 68, respectively. Any one or more of these resistor-capacitor pairs may be coupled into the circuit by the setting of one or more of the single pole, single throw switches 60a–60d. Each switch 60a–60d is coupled between one of the resistor capacitor pairs and the junction between the probe connection 50 and the input of oscillator 20. The switches 60a–60d of step span switch 60 are set so that the effective resistance 27 and effective capacitance 46 produce approximately a 3:1 range output, such as a 33 kHz output at oscillator 20 for a full scale variable capacitance 10' and a 100 kHz output at oscillator 20 for a zero variable capacitance 10'. Normalization in this manner makes conversion to a duty cycle very easy in that only resistance 27 and capacitance 46 need to be changed to change the measured full scale capacitance. Any one or more of the resistor-capacitor pairs would cause the probe oscillator circuitry 20 to output approximately the same frequency with no capacitance added between probe and ground. As the probe capacitance changes due to changes in level of the material in the vessel, the total charging capacitance changes because variable capacitance 10' is effectively in parallel with whichever of the capacitors 65, 66, 67, and 68 have been selected at step span switch 60.

The result of this circuit configuration is that a wide range of input full scale capacitances can result in a restricted range of frequency outputs from the flip-flop 26 by proper choice of switch closures of the step span switch 60. This normalized range of oscillation has more advantages than easy range selection. It also prevents the multivibrator oscillator 20 from operating at a frequency so high that it becomes non-linear with changing capacitance. It is also possible to configure the circuit so that continuous adjustment of span and zero may be accomplished on any selected range. Finally, the range of oscillation may be restricted to frequencies high enough so that the resistive component of conductive coatings which may form on the sensing element will be largely ignored. Fifteen spans can be accommodated with just four switch/resistor/capacitor sets.

In order to properly follow the probe frequency to duty cycle generation, the circuit of FIG. 2 should be referred to together with the timing diagram of FIG. 4. The fixed and necessarily stable time base timer 29 of FIG. 2 is structured to produce pulses of less than 1 microsecond long at a pulse frequency not to exceed ¼ of the minimum probe frequency if significant overrange capability is desired. The rising edge of the time base output $F_{TB}$ will set $Q_s$ from flip-flop 31 to a high state, as shown by point $t_1$ on the timing diagram of FIG. 4. The first (and any succeeding) positive pulse edge at the clock input to flip-flop 31 from the probe oscillator output $F_{PR}$ will return $Q_s$ to a low logic level. This is seen at point $t_2$ on the timing diagram. The $Q_s$ output is used as the data input for the second flip-flop 32 whose output $Q_d$ produces the duty cycle signal. Since $Q_s$ cannot change instantaneously after a clock edge, it will present a high logic state to the data line of flip-flop 32 at the first probe output pulse edge following the beginning of a new time base period sending $Q_d$ to a high logic level if a flip-flop that does not require data "hold time" is used. At this transition, a 2 to 4 microsecond reset pulse, which is intentionally longer than the one microsecond on-time of the fixed time base pulse, is generated to reset $Q_s$ to a low level should the rising edge of the probe oscillator fall within the on-time of the fixed time base. This permits $Q_d$ to clock back to a low level at the next clock edge which is exactly one probe oscillator period later. Since this transition occurs in every time base interval, the duty cycle output signal $Q_d$ is equal to the frequency of the fixed time base divided by the frequency of the probe oscillator or, in other words, the period of the probe oscillator divided by the period of the probe fixed time base. The duty cycle of the signal $Q_d$ therefore increases linearly with variable capacitance 10'.

The right hand portion of the FIG. 4 timing diagram demonstrates what measures were taken to make certain that a larger overrange signal will always produce a duty cycle greater than 50 percent. It is seen between points $t_3$ and $t_4$ that the on-time of the duty cycle output actually lasts 2 probe oscillator time periods also extending between $t_3$ and $t_4$. This is because a new rising clock edge from the fixed time base occurs before the rising clock edge of the probe oscillator resulting in a duty cycle on time which extends into an additional probe time period.

One shot circuit 33 is included to prevent over-range signals that may produce a lower than full scale output.

Figure 5:
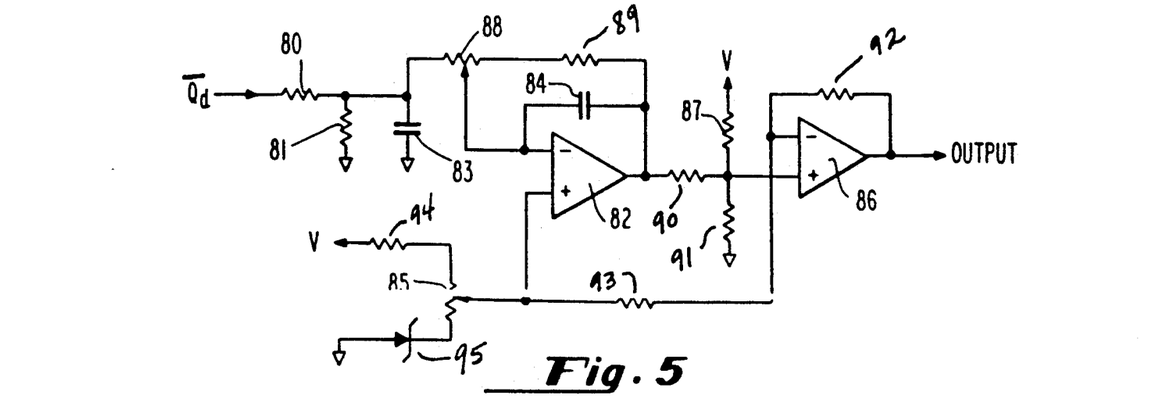
FIG. 5 depicts a span and zero calibration circuit for FIG. 2.

Construction and operation of the zero and span calibration circuits 45 of FIG. 2 can be seen from FIG. 5. In order to minimize the amplifier requirements, a complement of the duty cycle signal, $\overline{Q}_d$, is used as an input to the circuit. This complement is already available at the inverse data $\overline{Q}_d$ output of flip-flop 32 of FIG. 2. Thus, zero capacitance will be represented by a voltage near 6 volts and full scale will be somewhat less. The $\overline{Q}_d$ signal voltage is divided down in resistors 80 and 81 to a level easily handled by amplifier 82. Any ripple in the duty cycle is filtered by capacitor 83 and integrating capacitor 84. The circuit consisting of resistor 94, potentiometer 85 and reference diode 95 provides a precise range of zero adjustability. If a given capacitance is entered, and is to represent a zero percent output, then the zero adjustment potentiometer 85 is set so that its wiper voltage is equal to the voltage at the junction of resistors 90 and 91. This voltage will appear as a common mode voltage at the output of amplifier 82 but the unity gain differential amplifier formed by amplifier 86 and resistors 92 and 93 will ultimately subtract this voltage. In order to restore the output amplifier 86 to a normalized level compatible with the current output circuit, a bias level is introduced by the addition of resistor 87. After zero has been set, the full scale capacitance is fed to the multivibrator oscillator 20 and the span potentiometer 88 is set to obtain a full scale output signal. Resistor 89 and the setting of potentiometer 88 determine the gain of op-amp 32. Once the span potentiometer is adjusted, the value of zero will not be affected. Similarly, a new setting of the zero potentiometer 85 anywhere within a range will only cause a minimal change in the span.

There are several advantages from these circuit configurations:

1. The use of a symmetrical waveform permits buffering of the ramp signal with relative ease, i.e. the change in voltage versus time is minimal.

2. The normalized range of oscillation has more advantages than easy range selection. It also prevents the multivibrator oscillator 20 from operating at a frequency so high that it becomes non-linear with changing capacitance. It is also possible to configure this circuit so that continuous adjustment of span and zero may be accomplished on any selected range. FIG. 5 shows such a circuit arrangement, with non-interactive span and zero adjustments.

3. The multivibrator I.C. used as the probe oscillator 20 is commercially available in low power versions designated as L555 or 7555 and in monolithic dual versions known as the L556 and 7556. If the probe and the time base are incorporated in a dual IC, the resulting drifts of both devices (except the external timing components) will largely cancel each other, resulting in a very stable output over a wide range of operating temperatures.

4. While the circuit arrangement shown here is intended for continuous capacitance measurement, it should be noted that removal of the feedback resistor 40 would cause the output to change abruptly at a set level of the bias adjustment, causing the circuit to act as a level switch.

5. The circuit arrangement with its defined normalized voltage levels at the output amplifier lends itself easily to the addition of compensation currents to correct for variation in material dielectric constant, etc.

6. The circuitry discussed here is a loop powered 4 to 20 mA system, but would lend itself very easily to a 4 wire AC connection or 3 wire DC connection, where the additional power would be desirable to operate relays or low output impedance buffers.

The following components for the transmitter circuits of FIGS. 2 and 3 are suggested:

RESISTORS

| 21 | 100K ohms |
|---|---|
| 22 | 100K ohms |
| 23 | 100K ohms |
| 36 | 57.6K ohms |
| 40 | 49.9K ohms |
| 41 | 49.9K ohms |
| 42 | 100K ohms |
| 50' | 15k ohms |
| 51' | 15 Ohms |
| 52' | 15 Ohms |
| 61 | 100K ohms |
| 62 | 33.2K ohms |
| 63 | 10K ohms |
| 64 | 3.32K ohms |
| 80 | 50K ohms |
| 81 | 20K ohms |
| 85 | 2K ohms |
| 87 | 1M ohms |
| 88 | 50K ohms |
| 89 | 200K ohms |
| 90 | 100K ohms |

-continued

| | | |
|---|---|---|
| 91 | 100K | ohms |
| 92 | 100K | ohms |
| 93 | 100K | ohms |
| 94 | 18.2K | ohms |

CAPACITORS

| | | |
|---|---|---|
| 28 | 0.47 | uf |
| 37 | 0.1 | uf |
| 40a | 0.1 | uf |
| 41a | 50 | uf |
| 58 | 0.47 | uf |
| 59 | 0.47 | uf |
| 65 | 68 | pf |
| 66 | 250 | pf |
| 67 | 820 | pf |
| 68 | 2500 | pf |
| 83 | 0.1 | uf |
| 84 | 0.22 | uf |

COMPARATORS 24, 25—internal to 20 which is a TLC 556

AMPLIFIER

30—CA3046 configured as an amplifier
38—LM 258 H (½)
82—OP 20GZ
86—ICL 7612 BMTV

OTHER

Figure 6:
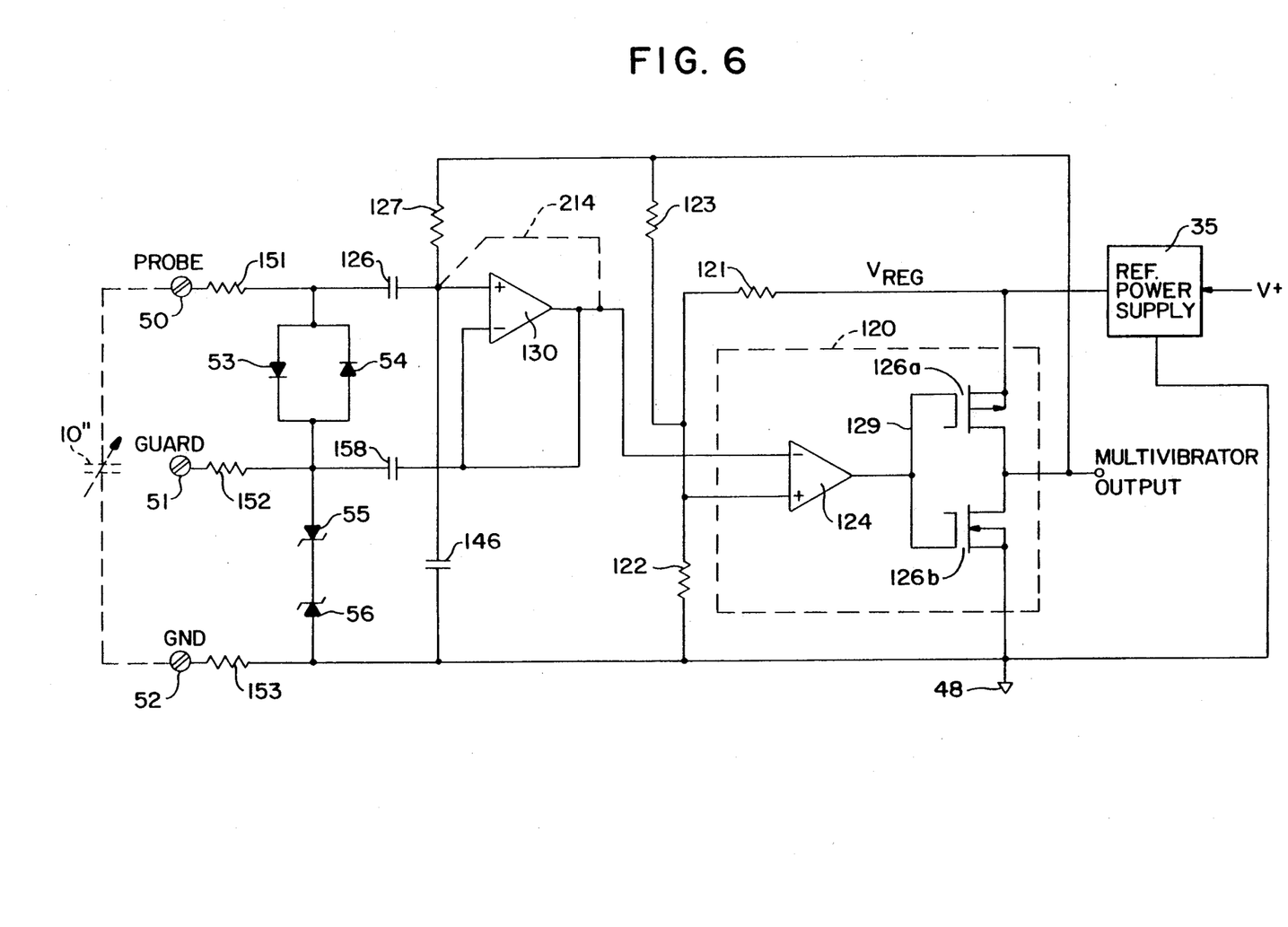
FIG. 6 depicts in block diagram form an alternate transmitter subcircuit embodiment.

CMOS D Type Flip-Flop 31, 32: CO 4013
One shot 33: CD 4001 configured as one shot
Transistor 39: 2N4923
Diodes 53, 54: IN459A
Diodes 55, 56: IN4733A
Diode 95: 9491 AM An alternate embodiment of an oscillator circuit is depicted in FIG. 6. The probe, guard and ground connections between the probe 10 and transmitter of FIG. 6 is similar to the connection between the probe and the preferred embodiment depicted in FIGS. 2 and 3. The probe output is carried to a bias level generating unity gain amplifier 130, the output of which is coupled to the guard connection 51 and carried to the negative input of a comparator 124 in a multivibrator oscillator 120. The output of the comparator 124 is fed to a transistor circuit 129 providing a variable frequency, variable period output. A reference power supply 35 provides a stable, predetermined voltage, passed through a voltage divider network of resistors 121 and 122. The divider output is fed to the remaining input of the comparator 124 when the resistance of 121 and 122 are equal so that the upper and lower thresholds of the comparator 124 are symmetric around V/2. The oscillator output is carried through resistor 123 to a junction between resistor 121 and the remaining comparator input. Resistor 123 sets the distance between the thresholds. CMOS transistor pairs 126a and 126b provide rail to rail swings of the output of the multivibrator oscillator 120 so as to prevent voltage errors in the threshold and in the charge/discharge voltage applied to the probe variable capacitance 10". Coupling capacitor 126 again permits the probe to have a zero voltage average with respect to common 48. Resistor 127 provides the charging and discharging current for the probe to ground variable capacitance 10' so that the charge/discharge mechanism is again symmetric. The unity gain amplifier 130 provides a voltage substantially equal to the probe voltage if the admittance of the charging capacitor 126 is large compared to the probe to ground admittance. If not, the non-inverting input to the amplifier 130 may be capacitively coupled to the probe input by a separate capacitor. The output of the buffer amplifier 130 is capacitively coupled through capacitor 158 to the guard terminal connection 51 and further prevents direct current from being carried to the probe. Resistors 150, 151 and 152 are current limiting resistors to protect spark protection diodes 53, 54, 55 and 56.

The guard buffer amplifier 130 may be omitted and the probe output carried directly to the non inverting input of comparator 124 as indicated by the broken line 214.

In order to provide the circuit with the ability to ignore conductive coatings on vertical insulated probes, i.e. to respond oppositely to the probe-ground resistance and to the probe-ground capacitance, discharge may be done rapidly rather than through the charge/discharge resistor 127. This may be accomplished with a switch placed in parallel with capacitor 146 which is closed when the multivibrator output is high.

Although a preferred embodiment and an alternate embodiment of the invention have been described and various changes thereto suggested, the invention is not limited to either the described embodiments or even the suggested changes but is set forth by the accompanying claims.

We claim:

1. Method for monitoring the condition of a material comprising:
    a) providing a plurality of different component values and a switch for selecting at least one of the component values;
    b) providing a first signal having a magnitude indicative of the condition of the material, the magnitude of the first signal varying with variations in the condition;
    c) converting the first signal to a second signal having a period that varies with variations in the magnitude of the first signal, a range of periods of the second signal being determined by a selected component value;
    d) selecting one of the component values via the switch depending upon an expected magnitude range of the first signal to maintain the period of the second signal within a selected range of periods for the expected magnitude range of the first signal;
    e) converting the second signal to a third, analog, signal having a magnitude that varies with variations of the period of the second signal, the third signal having a substantially fixed range of magnitudes for a wide magnitude range of the first signal as a result of selecting the component value in accordance with step (d); and,
    f) transmitting the third signal to a remote location.

2. Method for monitoring a condition of a material comprising:
    a) providing a plurality of different component values and a switch for selecting at least one of the component values;
    b) providing a first signal having a magnitude indicative of the condition of the material, the magnitude of the first signal varying with variations in the condition;

c) converting the first signal to a second signal having a period that varies with variations in the magnitude of the first signal, a range of periods of the second signal being determined by a selected component value;

d) selecting one of the component values via the switch depending upon an expected magnitude range of the first signal to maintain the period of the second signal within a selected range of periods for the expected magnitude range of the first signal;

e) converting the second signal to a digital duty cycle signal having a duty cycle that varies with variations in the period of the second signal;

f) concerting the duty cycle signal to a third, analog, signal having a magnitude that varies with variations of the period of the duty cycle of the duty cycle signal, the third signal having a substantially fixed range of magnitudes for a wide magnitude range of the first signal as a result of selecting the component value in accordance with step (d); and, g) transmitting the third signal to a remote location.

* * * * *